United States Patent
Lin et al.

(10) Patent No.: US 12,218,225 B1
(45) Date of Patent: Feb. 4, 2025

(54) RADICAL TREATMENT IN SUPERCRITICAL FLUID FOR GATE DIELECTRIC QUALITY IMPROVEMENT TO CFET STRUCTURE

(71) Applicant: Taiwan Semiconductor Manufacturing Company, Ltd., Hsin-Chu (TW)

(72) Inventors: Cheng-Ming Lin, Kaohsiung (TW); Kenichi Sano, Hsinchu (TW); Wei-Yen Woon, Taoyuan (TW); Szuya Liao, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 18/390,272

(22) Filed: Dec. 20, 2023

Related U.S. Application Data

(63) Continuation of application No. 18/515,921, filed on Nov. 21, 2023.

(51) Int. Cl.
| | | |
|---|---|---|
| *H01L 29/66* | (2006.01) | |
| *H01L 21/8238* | (2006.01) | |
| *H01L 27/088* | (2006.01) | |
| *H01L 27/092* | (2006.01) | |
| *H01L 29/423* | (2006.01) | |

(52) U.S. Cl.
CPC ........... *H01L 29/66795* (2013.01); *H01L 21/823821* (2013.01); *H01L 27/0886* (2013.01); *H01L 27/0922* (2013.01); *H01L 29/42392* (2013.01); *H01L 29/66545* (2013.01)

(58) Field of Classification Search
CPC ....... H01L 29/66795; H01L 21/823821; H01L 27/0886; H01L 29/66545; H01K 29/42392
See application file for complete search history.

(56) References Cited

U.S. PATENT DOCUMENTS

| | | | |
|---|---|---|---|
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 2008/0242071 | A1* | 10/2008 | Wang ............... H01L 29/51 257/E21.294 |
| 2023/0420460 | A1* | 12/2023 | Huang ............. H01L 23/5286 |

FOREIGN PATENT DOCUMENTS

| | | |
|---|---|---|
| TW | 201523884 A | 6/2015 |
| TW | 201926681 A | 7/2019 |

\* cited by examiner

*Primary Examiner* — Meiya Li
(74) *Attorney, Agent, or Firm* — HAYNES AND BOONE, LLP

(57) ABSTRACT

The present disclosure provides a method that includes providing a semiconductor structure having a bottom channel region and a top channel region over the bottom channel region; forming a gate dielectric layer over and wrapping around top channels in the top channel region; performing a radical treatment on the dielectric layer in a supercritical fluid; and forming a metal gate electrode on the dielectric layer.

20 Claims, 5 Drawing Sheets

RADICAL TREATMENT IN SUPERCRITICAL FLUID FOR GATE DIELECTRIC QUALITY IMPROVEMENT TO CFET STRUCTURE

PRIORITY DATA

This application is a continuation of U.S. patent application Ser. No. 18/515,921 filed on Nov. 21, 2023, the entire disclosure of which is hereby incorporated herein by reference.

BACKGROUND

The present disclosure relates to an integrated circuit (IC) structure and a method of making the same. Especially, the IC structure includes a transistor structure having multiple vertically stacked gate-all-around transistors, each of which includes multiple vertically stacked nanowires or nanosheets as channels. More specifically, the IC structure includes a complementary field-effect transistor (CFET) structure and the method of making the CFET. The CFET includes N-type FETs and P-type FETs vertically stacked.

CFET structure provides advantages over other field-effect transistors in power efficiency, performance, and transistor density. However, these potential benefits are dependent on overcoming significant technical challenges in fabrication and design. In particular, CFETs are projected to require the usage of extremely precise lithography (such as High numerical aperture (NA) extreme ultraviolet lithography (EUV) tools) to integrate both n-type and p-type FETs into a single device, as well as determining the most ideal materials to ensure appropriate electronic properties. For CFETs, processing margins are squeezed in various aspects including features sizes, alignment, thermal budget and so on. For example, existing gate structure and methods forming various materials including gate dielectric and gate electrode are facing more challenges to achieve the desired gate structure for its quality and threshold voltage, especially when it is associated with more complicated and subtle processing design. Accordingly, although existing CFET devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
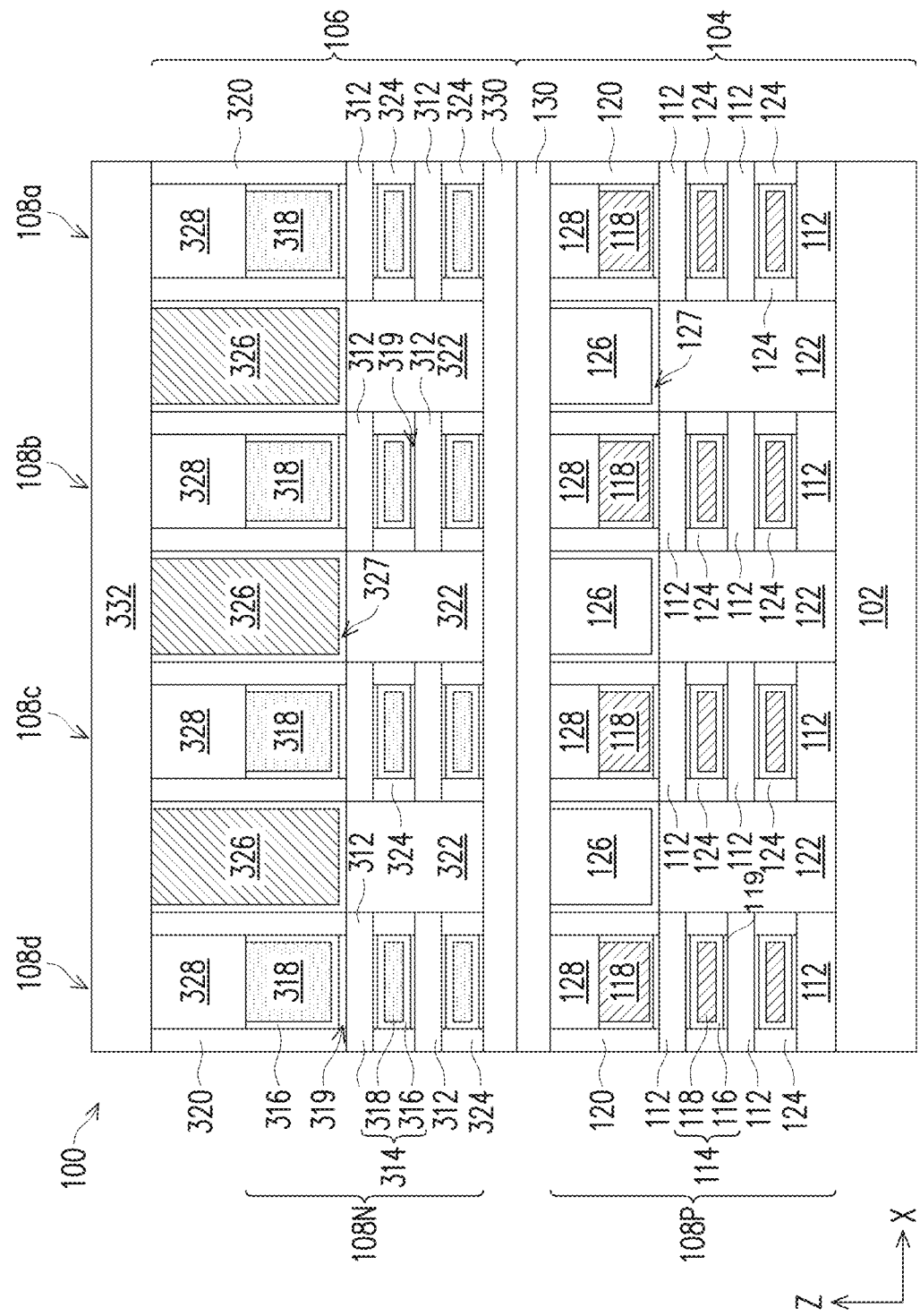
FIG. 1 illustrates a cross-sectional view of a CFET semiconductor device, according to various aspects of the present disclosure.

The present disclosure relates generally to integrated circuit devices, and more particularly, to multigate devices, such as fin field-effect transistor (FinFET), gate-all-around (GAA) devices, and complementary field-effect transistor (CFET) structure.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described, or other values as understood by person skilled in the art. For example, the term "about 5 nm" encompasses the dimension range from 4.5 nm to 5.5 nm.

The present disclosure relates to an integrated circuit (IC) structure having one or more CFET devices and the method making the same, especially the method of treating various gate stacks in low temperature to achieve the desired quality without extra thermal annealing impacting other components or devices already formed in the IC structure. In the CFET device, an n-type FET (NFET) and a p-type FET (PFET) are vertically stacked on each other with reduced circuit area and improved device performance. A CFET device can be formed in any suitable procedure, such as monolithic process, sequential process, parallel process, other suitable process, or a combination thereof. Take the sequential process as an example, In the sequential process, bottom tier devices are formed first, and thereafter top tier devices are formed. Particularly, one of NFET and PFET is formed first on one of the bottom tier devices; and another one is formed thereafter on the top tier devices, such as NFET being formed first and PFET being formed thereafter. In this case, any thermal process applied to PFET would also negatively impact to already formed NFET, which may be over the thermal budget of NFET and degrades the performance of NFET, such as threshold voltage and on-state current of NFET.

The present disclosure provides a method to treat the gate dielectric material using a supercritical fluid having one or more proper radical at a low temperature less than 200° C., or less than 100° C. A gate stack including gate dielectric and gate electrode is desired to be treated, usually using a thermal annealing process to improve the characteristics of a gate stack including reducing the defects, densifying gate material, reducing threshold voltage, and increasing threshold voltage.

In the disclosed method, the gate material, especially gate dielectric, of the top tier devices is treated in a supercritical carbon dioxide fluid dissolved with one or more radical, such as hydrogen radical (H*), deuterium radical (D*), oxygen radical (O*), fluorine radical (F*) or a combination thereof.

In the existing structure and method, the gate electrode is formed by a procedure that includes a high temperature (such as greater than 800° C. or 900° C.) annealing process, which will impact the electrical performance of the CFET device, such as the already-formed bottom tier devices.

In the present disclosure, an integrated circuit structure includes one or more CFET devices wherein the corresponding gate stacks are formed by a procedure that includes an ultralow temperature (less than 200° C. or less than 100° C.) radical treatment. Particularly, a supercritical carbon oxide ($CO_2$) fluid is applied with a gas of $H_2$ and $D_2$, or a gas of $O_2$ and $F_2$ dissolved therein under an ultralow temperature (less than 200° C., less than 100° C. or ranging between 100° C. and 200° C.) and a proper pressure, such as a pressure ranging between 100 Torr and 200 Torr. This process is referred to as a radical treatment in supercritical fluid. In some embodiments, one radical treatment in supercritical fluid dissolved with one or more radical, such as hydrogen radical (H*), deuterium radical (D*), is applied to an interfacial layer and another radical treatment in supercritical fluid dissolved with one or more radical, such as oxygen radical (O*), fluorine radical (F*), is applied to a high-k dielectric layer of the gate stack.

Supercritical carbon dioxide ($scCO_2$) is a fluid state of carbon dioxide held at or above its critical temperature and critical pressure. Carbon dioxide usually behaves as a gas in air at standard temperature and pressure (STP), or as a solid (called dry ice) when cooled and/or pressurized sufficiently. If the temperature and pressure are both increased from STP to be at or above the critical point for carbon dioxide, it can adopt properties midway between a gas and a liquid. More specifically, it behaves as a supercritical fluid above its critical temperature (31° C.) and critical pressure (72.8 atm), expanding to fill its container like a gas but with a density like that of a liquid. In the present disclosure, supercritical $CO_2$ is used as solvent due to its relatively low toxicity and environmental impact, and relatively low temperature of the process and the stability of $CO_2$.

A CFET device is a type of transistor that combines both n-type and p-type FETs (NFETs and PFETs) on the same stack, allowing for a more efficient use of space and power. In some embodiments, the CFET device includes n-type and p-type FETs respectively formed on a bottom level and a top level of a same semiconductor substrate so that corresponding n-type and p-type FETs are vertically stacked. The corresponding processing method is referred to as a monolithic method. In some embodiments, the CFET device includes n-type and p-type FETs respectively formed on different semiconductor substrates bonded together at later stage so that corresponding n-type and p-type FETs are vertically stacked. The corresponding processing method is referred to as a sequential method. In the sequential method according to some embodiments, the NFETs (PFETs) are first formed on the bottom tier substrate and then bonded to the top tier substrate. When the PFETs (or NFETs) are formed on the top tier substrate and a high temperature thermal annealing is applied to the gate structure of the PFETs (or NFETs) of the top tier substrate, it is also applied to the NFETs (or PFETs)) formed on the bottom tier substrate bonded to the top tier substrate and causes additional undesired thermal annealing to the NFETs (or PFETs)) formed on the bottom tier substrate. By utilizing the disclosed supercritical fluid treatment, this undesired thermal annealing can be avoided.

FIG. 1 illustrates a cross-sectional view of an IC structure 100 having one or more CFET semiconductor device formed by a sequential process 500. As an exemplary embodiment, FIG. 1 shows four CFET devices 108a, 108b, 108c, and 108d formed on a substrate 102. Those CFET devices 108a-108d are collectively referred to by numeral 108. The IC structure 100 may include more CFET devices, other active devices, and passive devices integrated on the same substrate 102. Furthermore, the IC structure 100 includes a bottom tier structure (or device) 104 and a top tier structure (or device) 106 bonded together during the sequential process. In one embodiment for illustration, each CFET device 108 in the IC structure 100 includes an NFET device 108N vertically stacked over a PFET device 108P. More specifically, the PFETs 108P are formed in the bottom tier structure 104 and the NFETs 108N are formed on the top tier structure 106. However, this is for illustration and is not intended to be limiting. It is understood that a CFET may include a PFET vertically stacked over an NFET in some other embodiments. The PFETs and the NFETs are further described, respectively.

The bottom tier structure 104 and the PFETs 108P are described below. The bottom tier structure 104 includes a bottom substrate 102. The bottom substrate is semiconductor substrate, such as a silicon substrate according to some embodiments. Each of the PFETs 108P formed in the bottom tier structure 104 is formed on the bottom substrate 102 and includes a multi-channel structure, which is also referred to as gate-all-around (GAA) structure. In a GAA structure, multiple channels (or bottom multiple channels) 112, such as nanosheets or nanowires, are vertically stacked and distanced from each other. The bottom gate structure 114 is configured to wrap around each of the multiple channels 112 vertically stacked on the bottom substrate 102. Each gate structure 114 includes a gate dielectric layer 116 disposed on the channels 112, and a gate electrode 118 disposed on the gate dielectric layer 116. The gate dielectric layer 116 includes a high k dielectric material, such as metal oxide, metal nitride, metal oxynitride or a combination thereof. The gate structure 114 may further includes an interfacial layer 119 disposed between the channels 112 and the high-k dielectric material layer of the gate dielectric layer 116. The interfacial layer 119 may include silicon oxide or other suitable dielectric material. The gate electrode 118 includes one or more conductive material, such as a capping layer, a work function metal layer, and a filling metal layer. Note that the work function metal layer is different for PFET and NFET. The gate dielectric layer 116 and the gate electrode 118 collectively form a gate stack corresponding to one PFET 108P. The gate structure 114 includes a plurality of gate stacks corresponding to a plurality of PFETs 108P. The gate structure 114 further includes gate spacers 120 disposed on sidewalls of the gate stack 114. The PFET 108P further includes a source and a drain, collectively being referred to as S/D features 122. The S/D features 122 are disposed on both sides of channels 112 and are configured to connect with the channels 112. The gate stack (including gate dielectric layer 116 and gate electrode 118) is separated from the S/D features 122 by inner spacers 124. More specially, the inner spacers 124 and the gate spacers 120 are vertically aligned to collectively isolate the gate electrode 118 from the S/D features 122. The bottom tier structure 104 may further include S/D contacts 126 landing on the S/D features 122 and electrically connect the S/D features 122 to power signal lines. The S/D contacts 126 may further include a barrier layer 127 to prevent from interdiffusion. The bottom tier structure 104 may further include a dielectric feature 128 formed on the gate electrode 118 and vertically aligned with the gate electrode 118 to protect the gate electrode 118 and benefit the subsequent processing operations applied to the gate electrode 118. In the disclosed embodiments, a bonding dielectric material layer 130 is deposited on the top surface of the bottom tier structure to provide a proper bonding surface for bonding the bottom tier structure 104 and the top tier structure 106 together at later stage. Especially, during the formation of the gate structure 114, the dielectric layer 116 is treated for improved gate dielectric integrity and device performance. In some embodiments, the gate dielectric layer is treated by a thermal annealing process with an elevated temperature, such as a temperature greater than 900° C., such as in a range between 900° C. and 1000° C. to reduce effective oxide thickness (EOT). In furtherance of the embodiments, the thermal annealing is implemented in a nitrogen environment. Alternatively, the gate dielectric layer is treated by a supercritical fluid as described above, which has a temperature less than 200° C., less than 100° C. or ranging between 100° C. and 200° C.

The top tier structure 106 and the NFETs 108N are described below. The NFETs 108N are similar to PFETs 108P in term of structure but are opposite doped. For example, the S/D features in PFETs are doped with P-type dopant such as boron and the S/D features in NFETs are doped with N-type dopant such as phosphorous. Each of the NFETs 108N formed in the top tier structure 106 includes a multi-channel structure, which is also referred to as gate-all-around (GAA) structure. In a GAA structure, multiple channels 312, such as nanosheets or nanowires, are vertically stacked and distanced from each other. The gate structure 314 is configured to wrap around each of the multiple channels 312 vertically stacked on the substrate 102. Each gate structure 314 includes a gate dielectric layer 316 disposed on the channels 312, and a gate electrode 318 disposed on the gate dielectric layer 316. The gate structure 314 may further includes an interfacial layer 319 disposed between the channels 312 and the high-k dielectric material layer of the gate dielectric layer 316. The interfacial layer 319 may include silicon oxide or other suitable dielectric material. The gate electrode 318 includes one or more conductive material, such as a capping layer, a work function metal layer, and a filling metal layer. Note that the work function metal layer is different for PFET and NFET. The gate dielectric layer 316 and the gate electrode 318 are collectively referred to as a gate stack. The gate structure 314 further includes gate spacer 320 disposed on sidewalls of the gate electrode 318. The NFET 108N further includes a source and a drain, collectively being referred to as S/D features 322. The S/D features 322 are disposed on both sides of channels 312 and are configured to connect with the channels 312. The gate stack (including gate dielectric layer 316 and gate electrode 318) is separated from the S/D features 322 by inner spacers 324. More specially, the inner spacers 324 and the gate spacers 320 are vertically aligned to collectively isolate the gate electrode 318 from the S/D features 322. The top tier structure 106 may further include S/D contacts 326 landing on the S/D features 322 and electrically connect the S/D features 322 to power signal lines. The S/D contacts 326 may further include a barrier layer 327 to prevent from interdiffusion. The top tier structure 106 may further include a dielectric feature 328 formed on the gate electrode 318 and vertically aligned with the gate electrode 318 to protect the gate electrode 318 and benefit the subsequent processing operations applied to the gate electrode 318. In the disclosed embodiments, a bonding dielectric material layer 330 is deposited on the surface of the top tier structure to provide a proper bonding surface for bonding the bottom tier structure 104 and the top tier structure 106 together at later stage. The top tier structure 106 may further include other features, components and structures formed over the NFETs, such as interconnect structure, and a passivation layer with redistribution layer and bond pads, through semiconductor via (TSV) to electrically connect the PFETs in the bottom tier structure 104 and the NFETs in the top tier structure 106. These features are collectively referred to by the numeral 332.

Especially, during the formation of the gate structure 314, the dielectric layer 316 is treated for improved gate dielectric integrity and device performance. The gate dielectric layer is treated by a supercritical fluid as described above, which has a temperature less than 200° C., less than 100° C. or ranging between 100° C. and 200° C. In some embodiments, a supercritical carbon oxide ($CO_2$) fluid is applied with a gas of $H_2$ and $D_2$, or a gas of $O_2$ and $F_2$ dissolved therein under an ultralow temperature (less than 200° C., less than 100° C. or ranging between 100° C. and 200° C.) and a proper pressure, such as a pressure ranging between 100 Torr and 200 Torr. This process is referred to as a radical treatment in supercritical fluid. In some embodiments, one radical treatment in supercritical fluid dissolved with one or more radical, such as hydrogen radical (H*), deuterium radical (D*), is applied to an interfacial layer 319 and another radical treatment in supercritical fluid dissolved with one or more radical, such as oxygen radical (O*), fluorine radical (F*), is applied to a high-k dielectric layer 316 of the gate stack.

Figure 2A:
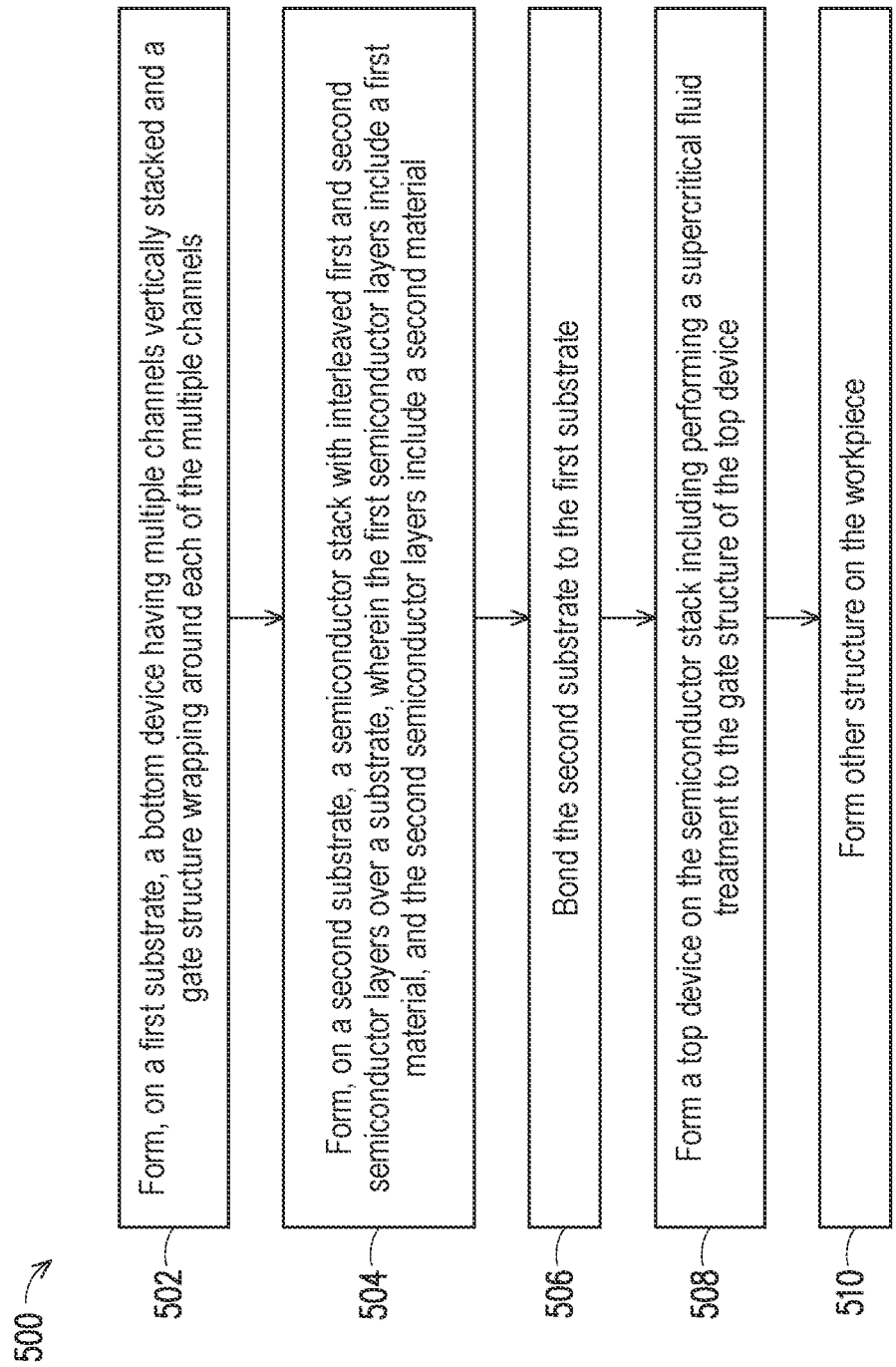
FIGS. 2A, 2B and 2C are flowcharts of a method to form the CFET semiconductor device, according to various aspects of the present disclosure.
Figure 2B:
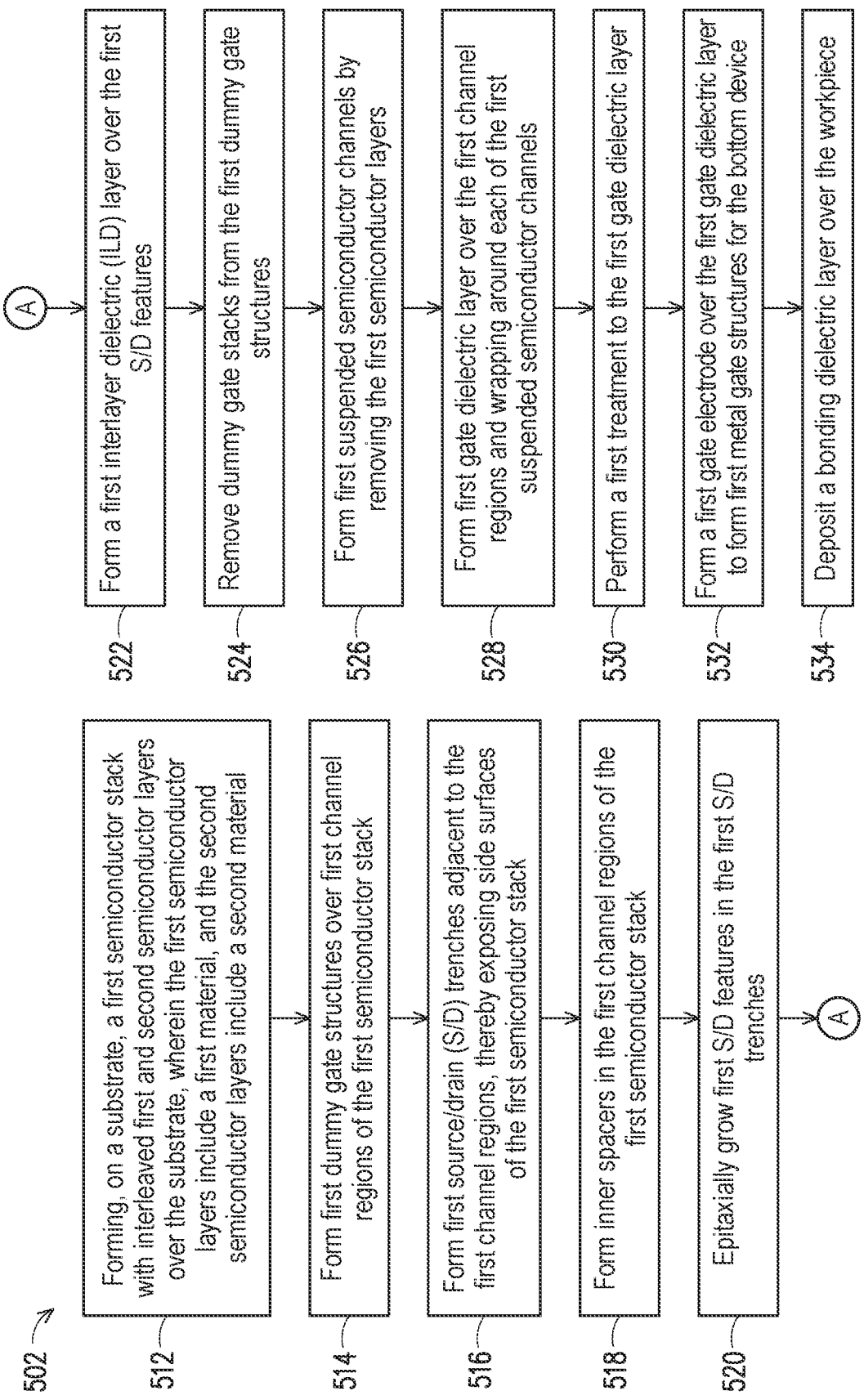
Figure 2C:
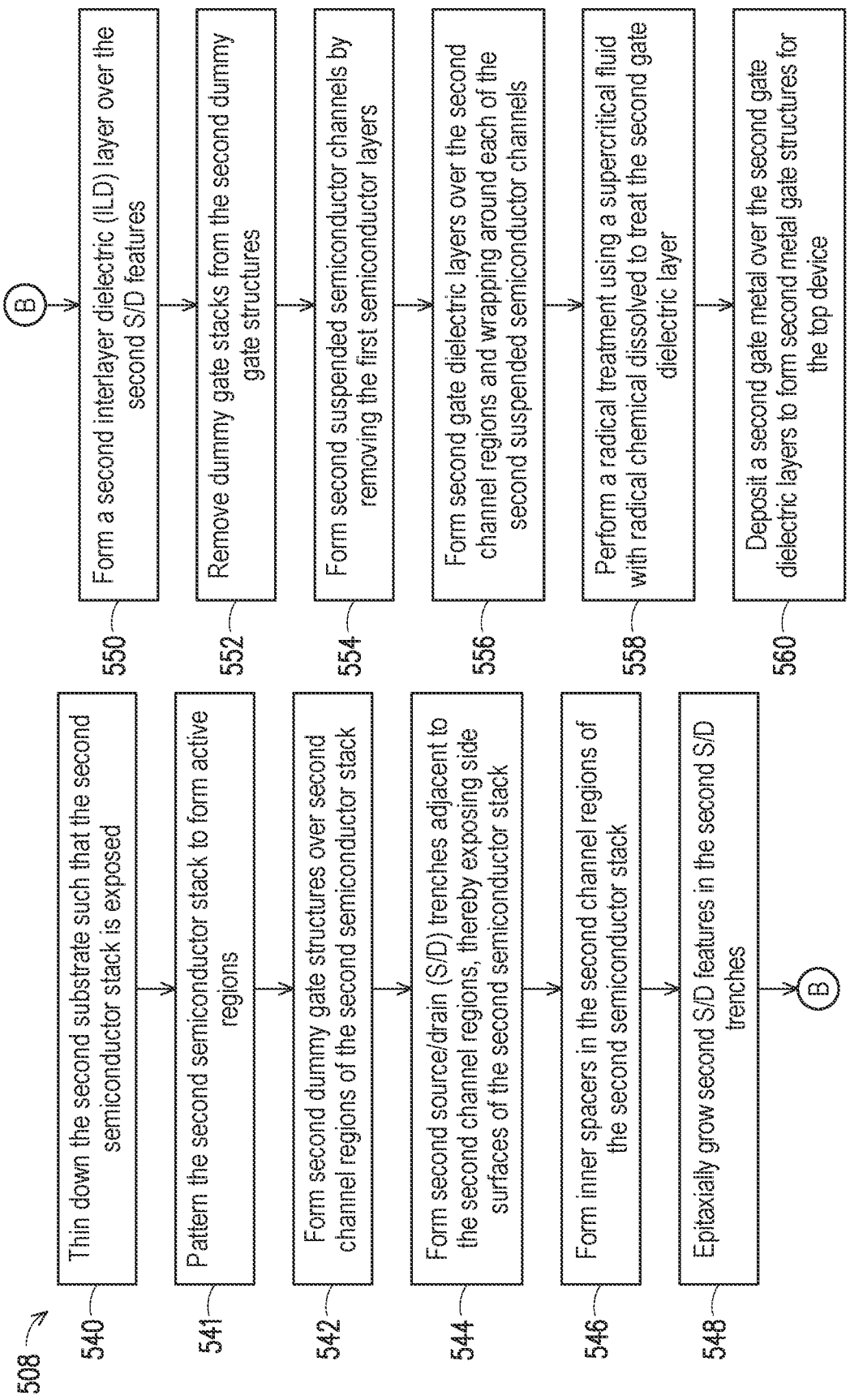
Figure 3:
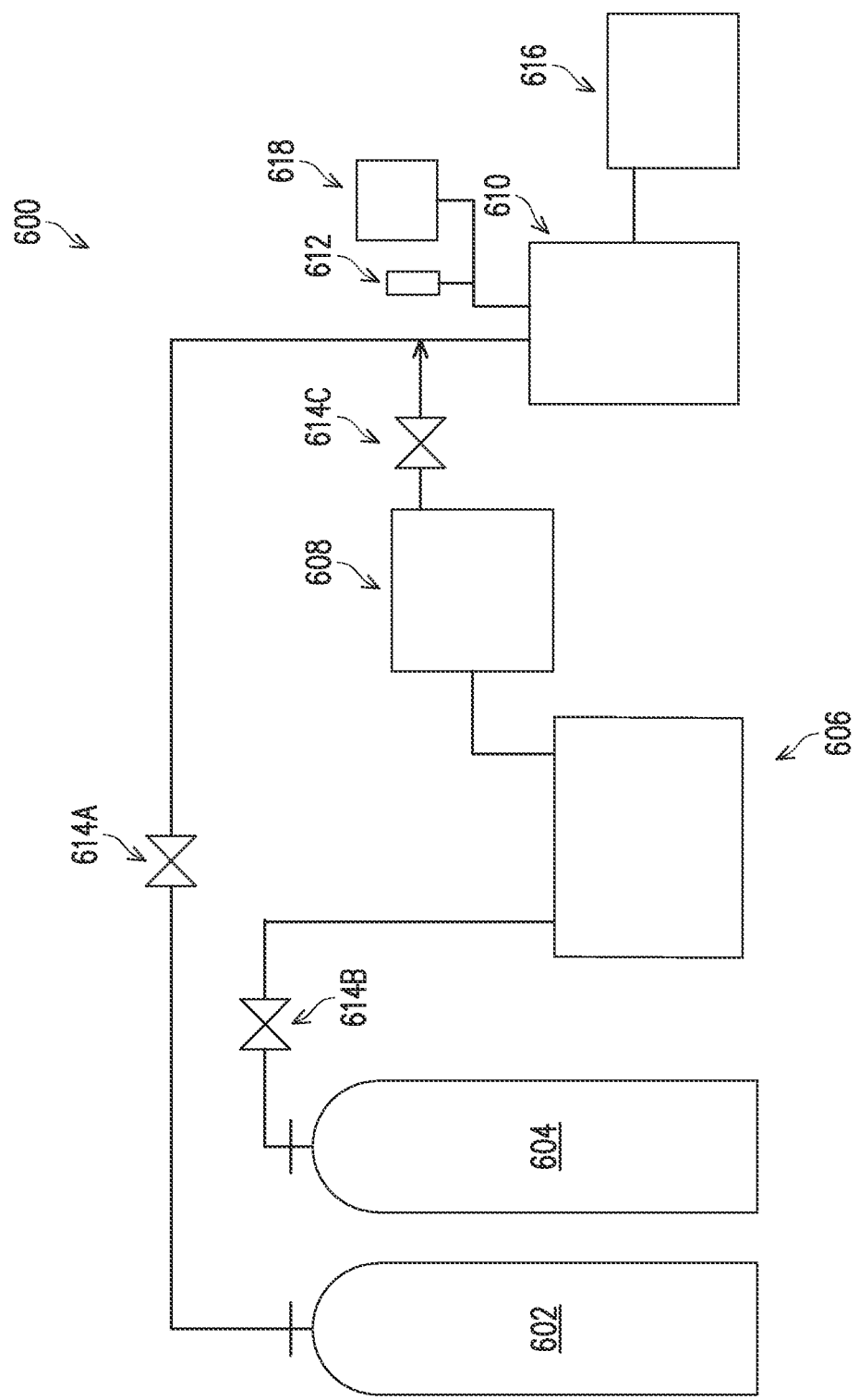
FIG. 3 illustrates a schematic view of a system for radical treatment in a supercritical fluid according to an embodiment of the present disclosure.

The method 500 to form the IC structure 100 including the operations for supercritical fluid treatment is further described with FIGS. 2A, 2B, 2C and other figures. FIGS. 2A, 2B and 2C are flowcharts of a method 500 constructed in accordance with some embodiments. FIG. 3 is a schematic view of a system for supercritical fluid treatment constructed in accordance with some embodiments.

Referring to FIG. 2A, the method 500 includes an operation 502 to form, on a first substrate, a bottom device having multiple channels vertically stacked, a gate structure wrapping around each of the multiple channels, and source/drain features interposed by the gate structure. In some embodiments, the bottom device incudes PFETs in GAA structure, such as those illustrated in FIG. 1. The method 500 includes an operation 504 to form, on a second substrate, a semiconductor stack having interleaved first and second semiconductor layers over the second substrate, wherein the first semiconductor layers include a first material, and the second semiconductor layers include a second material different from the first material. The method 500 includes an operation 506 to bond the first and second substrates together through proper bonding method. In some embodiments, the first and second substrates are bonded together in a way the frontside of the first substrate and the frontside of the second substrate are facing each other. In furtherance of the embodiments, a dielectric material layer is deposited on the frontside of the first substrate and the frontside of the second substrate so that the dielectric material layers function as bonding surfaces, as illustrated in FIG. 1. The method 500 includes an operation 508 to form a top device on the semiconductor stack. The top device may include NFETs, as illustrated in FIG. 1. Particularly, the operation 508 includes forming a gate structure and performing a supercritical fluid treatment to the gate dielectric layer, as described above. The method 500 further includes an operation 510 to form other structures, features and components of the IC structure 100, such as an interconnect structure having metal lines distributed in multiple metal layers, vias to vertically rout the metal lines, and contacts to couple the FETs and other devices into an integrated circuit; a passivation layer having redistributed layer and bond pads; and through-semiconductor vias (TSVs) to couple the bottom device to the top device.

The operation 502 to form the bottom device 104 includes a plurality of processing steps, such as those illustrated in FIG. 2B. Referring to FIG. 2B, the operation 502 includes a block 512 by forming, on a first substrate 102, a first semiconductor stack with interleaved first and second semiconductor layers over the substrate, wherein the first semiconductor layers include a first material, and the second semiconductor layers include a second material different from the first semiconductor material to achieve etch selectivity. In some embodiments, the first semiconductor material includes silicon germanium, and the second semiconductor material includes silicon. The first substrate 102 is a semiconductor substrate, such as a silicon substrate or a substrate additionally or alternatively having other semiconductor material. The formation of the first semiconductor stack includes depositing first and second semiconductor layers, patterning the first and second semiconductor layers to form the first semiconductor stack, and form an isolation structure surrounding the first semiconductor stack. In some embodiments, the isolation structure is a shallow trench isolation (STI) structure and includes one or more dielectric material, such as silicon oxide, low-k dielectric material, silicon oxynitride, other suitable dielectric material or a combination thereof.

Still referring to FIG. 2B, the operation 502 includes a block 514 by forming first dummy gate structures over first channel regions of the first semiconductor stack. The formation of the dummy gate structure includes deposition (such as polysilicon deposition) and patterning. The formation of the dummy gate structures further includes forming gate spacers 120 on sidewalls of the dummy gate stacks by deposition and anisotropic etching such as plasma etch. The gate spacers 120 include one or more suitable dielectric material such as silicon oxide, silicon nitride, other suitable dielectric material or a combination thereof.

Still referring to FIG. 2B, the operation 502 includes a block 516 by forming first source/drain (S/D) trenches by selectively etching the first semiconductor stack in the source/drain regions, thereby exposing side surfaces of the first semiconductor stack.

Still referring to FIG. 2B, the operation 502 includes a block 518 by forming inner spacers 124 in the first channel regions of the first semiconductor stack. The formation of the inner spacers 124 includes laterally recessing the first semiconductor layers of the first semiconductor stack; depositing one or more dielectric material layers (such as silicon oxide, silicon nitride, silicon oxynitride or a combination thereof); and performing an anisotropic etch such as plasma etching.

Still referring to FIG. 2B, the operation 502 includes a block 520 by forming first S/D features 122 in the first S/D trenches using selective epitaxial growth. The first S/D features 122 may include a semiconductor material same (such as silicon) or different (such as silicon germanium) from the substrate 102 to achieve strain effect.

Still referring to FIG. 2B, the operation 502 includes a block 522 by forming an interlayer dielectric (ILD) layer over the S/D features 122. The ILD layer includes one or more dielectric material, such as low-k dielectric material, silicon oxide and other suitable dielectric material or a combination thereof. The ILD layer may further include an etch stop layer, such as silicon nitride, disposed on the bottom to achieve etch selectivity and stop etch.

Still referring to FIG. 2B, the operation 502 includes a block 524 by removing the dummy gate stacks from the first dummy gate structures using an etching process, while gate spacers 120 remain, resulting in gate trenches.

Still referring to FIG. 2B, the operation 502 includes a block 526 by removing the first semiconductor layers of the first semiconductor stack in the gate trenches using an etching process to selectively etch the first semiconductor layers, result in the second semiconductor layers as the first suspended semiconductor channels 112.

Still referring to FIG. 2B, the operation 502 includes a block 528 by forming the gate dielectric layer 116 that includes a high-k dielectric material such as hafnium oxide, or other suitable high-k dielectric material (e.g., metal oxide, metal nitride) or a combination thereof. The gate dielectric layer 116 is deposited by a suitable method, such as chemical vapor deposition (CVD), atomic layer deposition (ALD), other suitable method or a combination thereof. The gate dielectric layer 116 is formed around each of the first channels 112 in the first channel regions. The gate dielectric layer 116 may further include an interfacial layer such as silicon oxide formed by thermal oxidation, atomic layer deposition or other suitable method.

Still referring to FIG. 2B, the operation 502 includes a block 530 by performing a first treatment to the first gate dielectric layer 116. In some embodiments, the first treatment is a thermal annealing with an annealing temperature greater than 800° C. or greater than 900° C., or ranging between 900° C. and 1000° C. In furtherance of embodiments, the first treatment is implemented in a nitrogen ($N_2$) environment to reduce EOT of the gate dielectric layer 116. In some alternative embodiments, the first treatment is a supercritical fluid treatment as described above.

Still referring to FIG. 2B, the operation 502 includes a block 532 by forming a first gate electrode 118 over the first gate dielectric layer 116 to form first metal gate structures for the bottom device. The first gate electrode 118 may include one or more metal or metal alloy. In some embodiments, the first gate electrode 118 includes a capping layer, a p-type work function metal and a filling metal, such as tungsten, copper, nickel, cobalt, other suitable metal or a combination thereof. The p-type work function metal for PFETs includes titanium nitride (TiN), tantalum nitride (TaN), tungsten nitride (WN), or a combination thereof according to some embodiments.

The operation 502 may include other processing steps, such as forming contacts 126 and forming the dielectric features 128 aligned with and capping the gate stack (including the gate dielectric layer 116 and the gate electrode 118). The operation 502 includes a block 534 by forming a bonding dielectric layer 130 over the workpiece. The formation of the bonding dielectric layer 130 may include performing a chemical mechanical polishing (CMP) process to planarize the top surface of the workpiece, and depositing a dielectric material, such as silicon oxide, silicon nitride, other suitable dielectric material, or a combination thereof.

Referring back to FIG. 2A, at the operation 504, a second semiconductor stack is formed on the second substrate. Another bonding dielectric layer 330 may be formed on the second semiconductor stack. At the operation 506, the first substrate and the second substrate are bonded together, such as frontside to frontside. The operation 508 forms the top device on the second semiconductor stack and includes performing a supercritical fluid treatment to the second gate dielectric layer of the top device, which is further described below with reference to FIG. 2C.

The operation 508 to form the top device 106 includes a plurality of processing steps, such as those illustrated in FIG. 2C. Referring to FIG. 2C, the operation 508 includes a block 540 by thinning down the second substrate such that the second semiconductor stack is exposed from the backside.

Still referring to FIG. 2C, the operation 508 includes a block 541 by patterning the second semiconductor stack to form active regions surrounded by isolation structure. The isolation structure includes shallow trench isolation (STI) features according to some embodiments. The formation of the active region and the isolation structure in block 541 may include patterning the second semiconductor stack, forming the isolation structure by deposition, CMP and selective etch to recess the isolation structure such that the active region is protruded above the isolation structure.

Still referring to FIG. 2C, the operation 508 includes a block 542 by forming, on the second substrate, second dummy gate structures over second channel regions of the second semiconductor stack. The formation of the second dummy gate structure includes deposition (such as polysilicon deposition) and patterning. The formation of the second dummy gate structures further includes forming gate spacers 320 on sidewalls of the dummy gate stacks by deposition and anisotropic etching such as plasma etch. The gate spacers 320 include one or more suitable dielectric material such as silicon oxide, silicon nitride, other suitable dielectric material or a combination thereof.

Still referring to FIG. 2C, the operation 508 includes a block 544 by forming second source/drain (S/D) trenches by selectively etching the second semiconductor stack in the source/drain regions, thereby exposing side surfaces of the second semiconductor stack.

Still referring to FIG. 2C, the operation 508 includes a block 546 by forming inner spacers 324 in the second channel regions of the second semiconductor stack. The formation of the inner spacers 324 includes laterally recessing the first semiconductor layers of the second semiconductor stack; depositing one or more dielectric material layers (such as silicon oxide, silicon nitride, silicon oxynitride or a combination thereof); and performing an anisotropic etch such as plasma etching.

Still referring to FIG. 2C, the operation 508 includes a block 548 by forming second S/D features 322 in the second S/D trenches using selective epitaxial growth. The second S/D features 322 may include a semiconductor material same (such as silicon) or different (such as silicon carbide) from the substrate 102 to achieve strain effect. The second S/D features 322 are dopped opposite to the first S/D features 122. For example, the first S/D features 122 of PFETs are doped with P-type dopant such as boron and the second S/D features 322 in NFETs are doped with N-type dopant such as phosphorous.

Still referring to FIG. 2C, the operation 508 includes a block 550 by forming an interlayer dielectric (ILD) layer over the S/D features 322. The ILD layer includes one or more dielectric material, such as low-k dielectric material, silicon oxide and other suitable dielectric material or a combination thereof. The ILD layer may further include an etch stop layer, such as silicon nitride, disposed on the bottom to achieve etch selectivity and stop etch.

Still referring to FIG. 2C, the operation 508 includes a block 552 by removing the dummy gate stacks from the second dummy gate structures using an etching process while gate spacers 320 remain, resulting in gate trenches.

Still referring to FIG. 2C, the operation 508 includes a block 554 by removing the first semiconductor layers of the second semiconductor stack in the gate trenches using an etching process to selectively etch the first semiconductor layers, result in the second semiconductor layers as the second suspended semiconductor channels 312.

Still referring to FIG. 2C, the operation 508 includes a block 556 by forming the gate dielectric layer 316 that includes a high-k dielectric material such as hafnium oxide, or other suitable high-k dielectric material (e.g., metal oxide, metal nitride) or a combination thereof. The gate dielectric layer 316 is deposited by a suitable method, such as chemical vapor deposition (CVD), atomic layer deposition (ALD), other suitable method or a combination thereof. The gate dielectric layer 316 is formed around each of the second channels 312 in the second channel regions. In the disclosed embodiments, the gate dielectric layer 316 may further include an interfacial layer 319 such as silicon oxide formed by thermal oxidation, atomic layer deposition or other suitable method.

Still referring to FIG. 2C, the operation 508 includes a block 558 by performing a second treatment to the second gate dielectric layer 316. The first treatment includes a supercritical fluid treatment to the second gate dielectric layer with a temperature less than 200° C. or less than 100° C., or ranging between 100° C. and 200° C. The dielectric layer 316 is treated for improved gate dielectric integrity and device performance. In some embodiments of the supercritical fluid treatment, a supercritical carbon oxide ($CO_2$) fluid is applied with a gas of $H_2$ and $D_2$, or a gas of $O_2$ and $F_2$ dissolved therein under an ultralow temperature (less than 200° C., less than 100° C. or ranging between 100° C. and 200° C.) and a proper pressure, such as a pressure ranging between 100 Torr and 200 Torr. This process is also referred to as a radical treatment in supercritical fluid. In some embodiments, the second treatment includes two radical treatments: one radical treatment in supercritical fluid dissolved with one or more radical, such as hydrogen radical (H*), deuterium radical (D*), is applied to an interfacial layer 319 and another radical treatment in supercritical fluid dissolved with one or more radical, such as oxygen radical (O*), fluorine radical (F*), is applied to a high-k dielectric layer 316 of the gate stack. In this case, the formation of the gate dielectric layer 316 includes forming an interfacial layer 319; performing first radical treatment in a first supercritical fluid dissolved with one or more radical, such as hydrogen radical (H*), deuterium radical (D*) or both;

forming a high-k dielectric layer of the gate dielectric layer 316; and performing second radical treatment in a second supercritical fluid dissolved with one or more radical, such as oxygen radical (O*), fluorine radical (F*) or both.

In some embodiments, the supercritical fluid in the radical treatment is supercritical carbon dioxide ($scCO_2$) fluid. Supercritical carbon dioxide ($scCO_2$) is a fluid state of carbon dioxide held at or above its critical temperature and critical pressure. Carbon dioxide usually behaves as a gas in air at standard temperature and pressure (STP), or as a solid (called dry ice) when cooled and/or pressurized sufficiently. If the temperature and pressure are both increased from STP to be at or above the critical point for carbon dioxide, it can adopt properties midway between a gas and a liquid. More specifically, it behaves as a supercritical fluid above its critical temperature (31° C.) and critical pressure (72.8 atm), expanding to fill its container like a gas but with a density like that of a liquid. In the present disclosure, supercritical $CO_2$ is used as solvent due to its relatively low toxicity and environmental impact, and relatively low temperature of the process and the stability of $CO_2$.

A radical treatment system 600 to perform the radical treatment using supercritical carbon dioxide ($scCO_2$) fluid is schematically illustrated in FIG. 3, constructed according to some embodiments. The radical treatment system 600 includes a radical source supply 602 to provide the radical chemical, such as $H_2$. The radical source supply 602 may be configured to provide more than one radical chemicals, such as hydrogen radical (H*), deuterium radical (D*), oxygen radical (O*), and fluorine radical (F*).

The radical treatment system 600 include a supercritical fluid source supply 604 to provide a chemical for supercritical fluid, such as carbon oxide ($CO_2$) for supercritical carbon oxide ($CO_2$) fluid.

The radical treatment system 600 further includes a cryostat module 606 connected to the supercritical fluid source supply 604 to receive carbon oxide and generate supercritical carbon oxide fluid.

The radical treatment system 600 further includes a pump 608 connected to the cryostat module 606 to pump the supercritical carbon oxide fluid to an autoclave module 610.

The radical treatment system 600 further includes an autoclave module 610 coupled to the cryostat module 606 (or directly connected to the pump 608) and the radical source supply 602 such that radical chemical from the radical source supply 602 and the supercritical carbon oxide fluid from the cryostat module 606 are mixed in the autoclave module 610 (the radical chemical(s) dissolved in the supercritical carbon oxide fluid) and are applied to the gate dielectric layer through the outlet 612 for radical treatment.

The radical treatment system 600 further includes various valves 614 to control the flow of the corresponding chemical, such as valves 614A, 614B and 614C. The radical treatment system 600 further includes a controller 616 designed to control the flow of the supercritical carbon oxide fluid with the radical chemical(s) dissolved. The radical treatment system 600 further includes other components, such as monitors 618 configured to monitor the flow of the supercritical carbon oxide fluid. The monitors 618 may be further coupled with the controller 616 to control the flow of the supercritical carbon oxide fluid in a feedback mode.

Referring back to FIG. 2C, the operation 508, after the radical treatment to the gate dielectric layer 316 at the block 558, further includes a block 560 by forming a second gate electrode 318 over the second gate dielectric layer 316 to form second metal gate structures 314 for the top device. The second gate electrode 318 may include one or more metal or metal alloy. In some embodiments, the second gate electrode 318 includes a capping layer, a n-type work function metal and a filling metal, such as tungsten, copper, nickel, cobalt, other suitable metal or a combination thereof. The n-type work function metal for NFETs includes tantalum (Ta); titanium aluminum (TiAl), titanium aluminum carbide (TiAlC), titanium aluminum oxide (TiAlO), titanium aluminum nitride (TiAlN), or a combination thereof according to some embodiments.

The operation 508 may include other processing steps, such as forming contacts 326 and forming the dielectric features 328 aligned with and capping the gate stack (including the gate dielectric layer 316 and the gate electrode 318). In some embodiments, the formation of the contacts 326 includes patterning the ILD layer to form contact holes by lithography process and etching; forming a barrier layer 327 such as depositing a titanium film and a titanium nitride film (or depositing a tantalum film and a tantalum nitride film); depositing metal to fill the contact holes; and performing a chemical mechanical polishing (CMP) process to planarize. In some embodiments, the formation of the dielectric features 328 includes selectively etch the gate stacks to recess the gate stacks; depositing one or more proper dielectric material in the recesses; and performing a CMP process to planarize, thereby forming the dielectric features 328 self-aligned with and capping the gate stacks.

The present disclosure provides CFET device and method making the same according to various embodiments. Particularly, an integrated circuit structure includes one or more CFET devices wherein the corresponding gate stacks are formed by a procedure that includes an ultralow temperature (less than 200° C. or less than 100° C.) radical treatment. Particularly, a supercritical carbon oxide ($CO_2$) fluid is applied with a gas of $H_2$ and $D_2$, or a gas of $O_2$ and $F_2$ dissolved therein under an ultralow temperature (less than 200° C., less than 100° C. or ranging between 100° C. and 200° C.) and a proper pressure, such as a pressure ranging between 100 Torr and 200 Torr. This process is referred to as a radical treatment in supercritical fluid. In some embodiments, one radical treatment in supercritical fluid dissolved with one or more radical, such as hydrogen radical (H*), deuterium radical (D*), is applied to an interfacial layer and another radical treatment in supercritical fluid dissolved with one or more radical, such as oxygen radical (O*), fluorine radical (F*), is applied to a high-k dielectric layer of the gate stack.

By implementing the disclosed device structure and the method making the same in various embodiments, some of advantages described below may present. However, it is understood that different embodiments disclosed herein offer different advantages and that no particular advantage is necessarily required in all embodiments. As one example, the gate dielectric layer is improved by radical treatment in a supercritical fluid with radical chemical dissolved therein at a low temperature without impacting the already formed FETs on the bottom device.

In one example aspect, the present disclosure provides a method that includes providing a semiconductor structure having a bottom channel region and a top channel region over the bottom channel region; forming a gate dielectric layer over and wrapping around top channels in the top channel region; performing a radical treatment on the gate dielectric layer in a supercritical fluid; and forming a metal gate electrode on the dielectric layer.

In another example aspect, the present disclosure provides a method that includes providing a semiconductor structure having a bottom channel region and a top channel region over the bottom channel region; forming an interfacial dielectric layer over, the interfacial dielectric layer wrapping around top channels in the top channel region; performing a first radical treatment to the interfacial dielectric layer in a first supercritical fluid having a first radical chemical dissolved therein; forming a high-k dielectric layer over the interfacial dielectric layer and wrapping around the top channels in the top channel region; performing a second radical treatment to the high-k dielectric layer in a second supercritical fluid having a second radical chemical dissolved therein; and forming a metal gate electrode on the high-k dielectric layer.

In yet another example aspect, the present disclosure provides a method that includes forming bottom channels vertically stacked in a bottom channel region on a bottom substrate; forming a bottom source and a bottom drain on the bottom substrate, the bottom source and the bottom drain being interposed by the bottom channel region; forming a bottom gate structure on the bottom channel region and wrapping around each of the bottom channels; performing a thermal annealing process to the bottom gate structure at a first temperature greater than 900° C.; forming a semiconductor stack of first semiconductor layers and second semiconductor layer alternatively stacked on a top substrate; bonding the semiconductor stack formed on the top substrate to the bottom substrate; thinning down the top substrate such that the semiconductor stack is exposed; patterning the semiconductor stack to form an active region; forming a dummy gate structure over the active region in a top channel region, the dummy gate structure including a dummy gate stack and gate spacers on sidewalls of the dummy gate stack; forming a top source and a top drain in the active region, the top source and the top drain being interposed by the dummy gate stack; removing the dummy gate stack and the first semiconductor layers in the top channel region, resulting in the second semiconductor layers as top channels in the top channel region; forming a gate dielectric layer over and wrapping around the top channels in the top channel region; performing a radical treatment on the dielectric layer in a supercritical fluid at a second temperature less than 200° C.; and forming a bottom metal gate electrode to the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a semiconductor structure having a bottom channel region and a top channel region over the bottom channel region, wherein the bottom channel region includes bottom channels and the top channel region includes top channels;
   forming an interfacial dielectric layer to wrap around each of the top channels;
   applying a first supercritical carbon dioxide fluid to the interfacial dielectric layer;
   forming a high-k dielectric layer on the interfacial dielectric layer and wrapping around the each of the top channels;
   applying a second supercritical carbon dioxide fluid to the high-k dielectric layer; and
   forming a gate electrode on the high-k dielectric layer.

2. The method of claim 1, wherein the applying of the first supercritical carbon dioxide fluid to the interfacial dielectric layer further includes:
   dissolving a first radical source gas in the first supercritical carbon dioxide fluid; and
   thereafter, applying the first supercritical carbon dioxide fluid dissolved with a first radical chemical to the interfacial dielectric layer at a temperature less than 100° C.

3. The method of claim 2, wherein the applying of the second supercritical carbon dioxide fluid to the high-k dielectric layer further includes:
   dissolving a second radical source gas in the second supercritical carbon dioxide fluid; and
   thereafter, applying the second supercritical carbon dioxide fluid dissolved with a second radical chemical to the high-k dielectric layer.

4. The method of claim 3, wherein the second radical chemical is different from the first radical chemical.

5. The method of claim 4, wherein
   the first radical chemical includes a hydrogen radical; and
   the second radical chemical includes an oxygen radical.

6. The method of claim 5, wherein
   the first radical chemical includes the hydrogen radical (H*) and a deuterium radical (D*); and
   the second radical chemical includes the oxygen radical (O*) and a fluorine radical (F*).

7. The method of claim 1, wherein the providing of the semiconductor structure having the bottom channel region and the top channel region further includes:
   forming the bottom channels vertically stacked on a bottom substrate;
   forming a bottom source and a bottom drain on the bottom substrate, the bottom source and the bottom drain being interposed by the bottom channels;
   forming a bottom gate dielectric layer wrapping around each of the bottom channels; and
   performing a thermal annealing process to the bottom gate dielectric layer at a temperature greater than 900° C.

8. The method of claim 7, wherein the providing of the semiconductor structure having the bottom channel region and the top channel region further includes:
   forming a semiconductor stack of first semiconductor layers and second semiconductor layers alternatively stacked on a top substrate;
   bonding the semiconductor stack formed on the top substrate to the bottom substrate; and
   thinning down the top substrate such that the semiconductor stack is exposed.

9. The method of claim 8, wherein the providing of the semiconductor structure having the bottom channel region and the top channel region further includes:
   patterning the semiconductor stack to form an active region; and
   forming a top source and a top drain in the active region, the top source and the top drain being interposed by the top channels.

10. A method, comprising:
    providing a semiconductor structure having a bottom channel region and a top channel region over the bottom channel region;

forming an interfacial dielectric layer that is wrapping around top channels in the top channel region;

performing a first radical treatment to the interfacial dielectric layer in a first supercritical carbon dioxide fluid having a first radical chemical dissolved therein;

forming a high-k dielectric layer over the interfacial dielectric layer and wrapping around the top channels in the top channel region;

performing a second radical treatment to the high-k dielectric layer in a second supercritical carbon dioxide fluid having a second radical chemical dissolved therein, the second radical chemical being different from the first radical chemical; and forming a gate electrode on the high-k dielectric layer.

11. The method of claim 10, wherein
the first radical chemical includes a hydrogen radical (H*);
the second radical chemical includes an oxygen radical (O*):
the performing of the first radical treatment to the interfacial dielectric layer includes performing the first radical treatment to the interfacial dielectric layer at a first temperature less than 100° C.; and
the performing of the second radical treatment to the high-k dielectric layer includes performing the second radical treatment to the high-k dielectric layer at a second temperature less than 100° C.

12. The method of claim 11, wherein
the performing of the first radical treatment to the interfacial dielectric layer further includes dissolving a first radical source gas in the first supercritical carbon dioxide fluid, and applying the first supercritical carbon dioxide fluid dissolved with the first radical chemical to the interfacial dielectric layer; and
the performing of the second radical treatment to the high-k dielectric layer further includes dissolving a second radical source gas in the second supercritical carbon dioxide fluid, and applying the second supercritical carbon dioxide fluid dissolved with the second radical chemical to the high-k dielectric layer.

13. The method of claim 12, wherein
the first radical chemical includes the hydrogen radical (H*) and a deuterium radical (D*); and
the second radical chemical includes the oxygen radical (O*), and a fluorine radical (F*).

14. The method of claim 11, wherein the providing of the semiconductor structure having the bottom channel region and the top channel region further includes:
forming bottom channels vertically stacked in the bottom channel region on a bottom substrate;
forming a bottom source and a bottom drain on the bottom substrate, the bottom source and the bottom drain being interposed by the bottom channel region;
forming a bottom gate structure in the bottom channel region to wrap around each of the bottom channels;
performing a thermal annealing process to the bottom gate structure at a temperature greater than 900° C.;
forming a semiconductor stack of first semiconductor layers and second semiconductor layers alternatively stacked on a top substrate; and
bonding the semiconductor stack formed on the top substrate to the bottom substrate.

15. The method of claim 14, wherein the providing of the semiconductor structure having the bottom channel region and the top channel region further includes:
thinning down the top substrate;
patterning the semiconductor stack to form an active region; and
forming a top source and a top drain in the active region, the top source and the top drain being interposed by the top channels.

16. A method, comprising:
forming bottom channels vertically stacked in a bottom channel region on a bottom substrate;
forming a bottom source and a bottom drain on the bottom substrate, the bottom source and the bottom drain being interposed by the bottom channel region;
forming a bottom interfacial layer wrapping around each of the bottom channels;
performing a thermal annealing process to the bottom interfacial layer at a first temperature greater than 900° C.;
forming a semiconductor stack of first semiconductor layers and second semiconductor layers alternatively stacked on a top substrate;
bonding the semiconductor stack formed on the top substrate to the bottom substrate;
thinning down the top substrate such that the semiconductor stack is exposed;
patterning the semiconductor stack to form an active region;
forming a top source and a top drain in the active region, the top source and the top drain being interposed by top channels in a top channel region;
forming a top gate dielectric layer over and wrapping around the top channels in the top channel region;
performing a radical treatment to the top gate dielectric layer in a supercritical fluid at a second temperature less than 200° C., wherein the supercritical fluid includes a radical chemical; and
forming a top gate electrode to the top gate dielectric layer.

17. The method of claim 16, wherein the forming of the top gate dielectric layer over and wrapping around the top channels in the top channel region further includes:
forming a top interfacial dielectric layer to wrap around each of the top channels, and
forming a top high-k dielectric material layer on the top interfacial dielectric layer to wrap around the each of the top channels.

18. The method of claim 17, wherein the performing of the radical treatment to the top gate dielectric layer in the supercritical fluid further includes:
dissolving a first radical source gas in a first supercritical carbon dioxide fluid;
applying the first supercritical carbon dioxide fluid dissolved with a first radical chemical to the top interfacial dielectric layer, prior to the forming of the top high-k dielectric material layer on the top interfacial dielectric layer to wrap around the each of the top channels;
dissolving a second radical source gas in a second supercritical carbon dioxide fluid after the forming of the top high-k dielectric material layer on the top interfacial dielectric layer to wrap around the each of the top channels; and
applying the second supercritical carbon dioxide fluid dissolved with a second radical chemical to the top high-k dielectric material layer, the second radical chemical being different from the first radical chemical.

19. The method of claim 18, wherein
the first radical chemical includes a hydrogen radical (H*); and the second radical chemical includes an oxygen radical (O*).

20. The method of claim 19, wherein the first radical chemical includes the hydrogen radical (H*) and a deuterium radical (D*); and the second radical chemical includes the oxygen radical (O*) and a fluorine radical (F*).

* * * * *